United States Patent [19]

Chamberlain et al.

[11] 4,019,199

[45] Apr. 19, 1977

[54] HIGHLY SENSITIVE CHARGE-COUPLED PHOTODETECTOR INCLUDING AN ELECTRICALLY ISOLATED REVERSED BIASED DIFFUSION REGION FOR ELIMINATING AN INVERSION LAYER

[75] Inventors: Savvas Georgiou Chamberlain, Waterloo, Canada; Lawrence Griffith Heller, Brewster, N.Y.

[73] Assignee: International Business Machines Corporation, Armonk, N.Y.

[22] Filed: Dec. 22, 1975

[21] Appl. No.: 642,862

[52] U.S. Cl. .................................. 357/24; 357/30; 357/52; 357/54
[51] Int. Cl.² .................. H01L 29/78; H01L 27/14; H01L 31/00; H01L 29/34
[58] Field of Search ................. 357/30, 52, 53, 24, 357/54

[56] References Cited

UNITED STATES PATENTS

| | | | |
|---|---|---|---|
| 3,473,032 | 10/1969 | LeHovec | 357/30 |
| 3,796,928 | 3/1974 | Doo et al. | 357/53 |
| 3,808,476 | 4/1974 | McCann | 357/30 |
| 3,816,769 | 6/1974 | Crowle | 357/30 |
| 3,877,053 | 4/1975 | Kaplit | 357/23 |
| 3,877,058 | 4/1975 | Cricchi | 357/30 |
| 3,893,151 | 7/1975 | Bosselaar et al. | 357/30 |

OTHER PUBLICATIONS

IBM Technical Disclosure Bulletin; by Jacobus; vol. 14, No. 9, Feb. 1972, p. 2624.

*Primary Examiner*—Andrew J. James
*Attorney, Agent, or Firm*—John J. Goodwin

[57] ABSTRACT

A solid-state charge-coupled photoconductor for image scanning including a p-type substrate having a silicon dioxide layer on the surface thereof with the exception of one or more areas in which an n+ diffusion area is located. A polysilicon gate is located over the silicon dioxide layer and a second silicon dioxide layer is located over the polysilicon layer and the n+ diffusion area except for a portion where a first aluminum contact window is provided which extends through the second silicon dioxide layer to the surface of the n+ diffusion area and where a second aluminum contact window extends through the second polysilicon gate to the surface of the polysilicon gate. The photosensitivity of the device is electronically controlled due to the relatively small n+ layer which is reversed biased with respect to the larger gate area.

4 Claims, 2 Drawing Figures

HIGHLY SENSITIVE CHARGE-COUPLED PHOTODETECTOR INCLUDING AN ELECTRICALLY ISOLATED REVERSED BIASED DIFFUSION REGION FOR ELIMINATING AN INVERSION LAYER

BACKGROUND OF THE INVENTION

1. Field of the Invention

The present invention relates generally to improved, highly light sensitive semiconductor devices and more particulary to a solid-state charge-coupled photoconductor having electronically controlled photosensivity.

2. Description of the Prior Art

Solid-state photodiode detectors are known and used for image detection such as pattern recognition, position sensing, image tracking, and many other applications.

For example, U.S. Pat. No. 3,812,518 entitled "Photodiode With Patterned Structure", issued May 21, 1974 to Kury et al and assigned to General Electric Company discloses a semiconductor photodiode having buried elongated strips of p-type diffusion regions to collect electron-hole pairs produced by a light sensitive surface n-layer. Elongated p-type strips are used to reduce the device capacitance and increase sensitivity.

U.S. Pat. No. 3,816,769 entitled "Method and Circuit Element for the Selective Charging of a Semiconductor Diffusion Region", issued June 11, 1974 to Crowle and assigned to integrated Photomatrix Ltd. also discloses a photosensitive detector including a first type substrate, an opposite type diffusion region and a gate region.

Further U.S. patents characteristic of the state of the art include U.S. Pat. No. 3,795,805 entitled "Method and Apparatus for Sensing Radiationand Providing Electrical Readout", issued Mar. 5, 1974 to Eichelberger and assigned to General Electric Company; U.S. Pat. No. 3,808,476 entitled "Charge Pump Photodetector", issued Apr. 30, 1974 to McCann, Jr. and assigned to Westinghouse Electric Corporation; and U.S. Pat. No. 3,814,955 entitled "Charge Coupled Semiconductor Element with Noise Cancellation", issued June 4, 1974 to Itok et al and assigned to Hitachi, Ltd.

The publication entitled "Photosensitivity and Scanning of Silicon Image Detector Arrays" by Savvas G. Chamberlin, IEEE Journal of Solid State Circuits, Vol SC-4, No. 6, December 1969 discusses basic principles of operation of planar Si $p+$—$n$ photodiodes for image scanning and is useful as a background teaching in the understanding of the present invention.

SUMMARY OF THE INVENTION

An object of the present invention is to provide a highly sensitive charge-coupled photodetector having substrate, diffusion and gate regions with unique geometry and bias properties.

Another object of the present invention is to provide a sensitive semiconductor photodetector having a polysilicon gate electron collection region which is very large compared to the diffusion region.

A further object of the invention is to provide a sensitive semiconductor photodetector wherein the effective capacitance of the device is that of the diffusion region which is small relative to the capacitance of the collection gate region.

Another object of the present invention is to provide a sensitive semiconductor photoconductor wherein the diffusion region is electrically isolated from the photodiode region.

Still another object of the present invention is to provide a sensitive semiconductor photodetector having a small output capacitance and therefore low thermal noise and high speed.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 2 also included a curve illustrating the surface potential gradient of the device.

DESCRIPTION OF THE PREFERRED EMBODIMENTS

Figure 1:
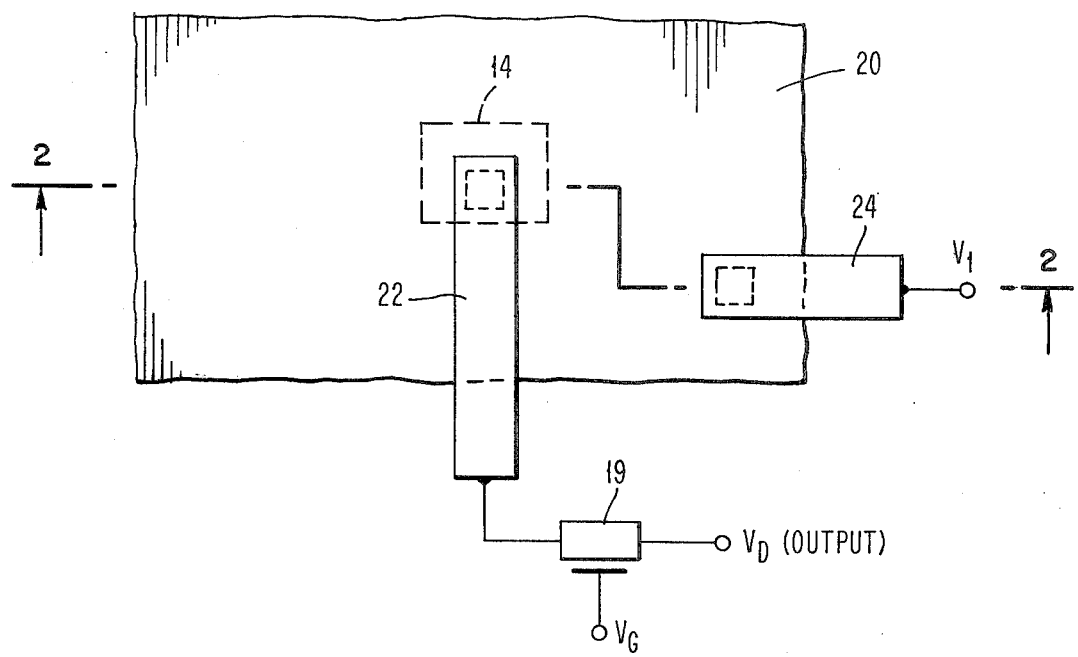
FIGS. 1 and 2 are diagrammatic plan and cross sectional views, respectively, illustrating one embodiment of a highly sensitive charge-coupled semiconductor photodetector according to the principles of the present invention.
Figure 2:
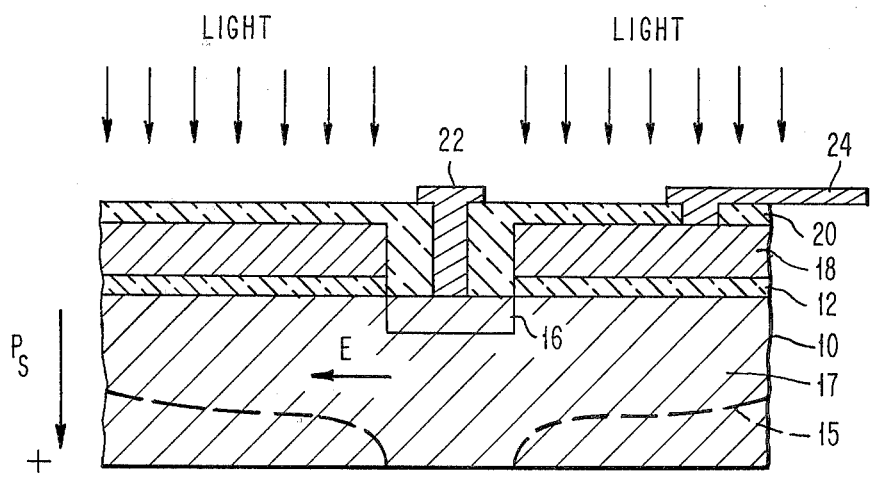

Reference is made to FIGS. 1 and 2 which show a plan and a sectional view of an embodiment of a highly sensitive semiconductor photodetector including a substrate 10 of p-type material, an insulating layer 12 which may be silicon dioxide overlaying the major portion of the upper surface of substrate 10 with the exception of an area 14 wherein an $n+$ diffusion region 16 is disposed into substrate 10. A gate layer 18 which may be polysilicon is located over the insulating layer 12 and a second insulating layer 20 which may be composed of silicon dioxide is disposed over both the gate layer 18 and extends down and over the $n+$ diffusion region 16 to cover the area 14.

A first contact 22 which may be composed of aluminum is disposed on insulating layer 20 and extends through layer 20 to contact the $n+$ diffusion region 16. A second contact 24 which also may be composed of aluminum is disposed on insulating layer 20 and extends through layer 20 to contact gate layer 18.

Contact 22 is connected to an active device 19 which is controlled by a d.c. gate supply potential $V_G$. The drain voltage $V_D$ of device 19 is the output signal of the photodetector. The second contact 24 is connected to a source of bias potential $V_1$.

In operation, light is directed onto the upper surface of insulating layer 20 and passes through layer 20, gate region 18, insulating layer 12 and into substrate 10. Light is also directed onto area 14. The light is obtained from the recoginition, sensing or tracking device being employed, and the light may be selectively directed onto the photodetector by means of fiber optics or the equivalent. The light can also be directed into region 10 from the opposite side.

In prior art photodetectors an inversion layer is normally formed between the insulating layer and the semiconductor layer, and the amount of charge in the inversion layer is proportional to the amount of light falling on the photodectector and the time of duration of the light. The charge produced in the inversion layer in the insulator-semiconductor interface produces an output voltage which is proportional to the light.

An important feature of the present invention is that a controllable bias voltage $V_1$ is applied through contact 24 to gate region 12. The bias voltage insures that the diffused region 16 is biased positive enough so that an inversion layer does not exist at the interface of dielectric layer 12 and substrate 10, and therefore diffusion region 16 is electrically isolated from the photodiode area 20 reducing the load and capacitance on the $n+$ diffusion region 16. Thus the carriers produced by the light are proportional to photodiode area 20 but the area 20 does not contribute a loading capacitance on the $n+$ diffusion region 16 with the result that the detector is highly sensitive.

Referring to FIG. 2 E represents the horizontal electric field which sweeps the carriers onto diffusion 16, and the dotted line portion 15 illustrates the surface potential profile Ps of the device, with positive potential being indicated in the downward direction. Region 17 defines the depletion region in region 10 and it can be seen that the surface potential becomes more positive in the region near $n+$ diffusion 16.

Thus, in the present invention the magnitude of the carriers produced by the light effect on P region substrate 10 are proportional to the large photodiode area 20 but are collected at the relatively small diffusion region 16 which is electrically isolated from area 20 as a result of the bias voltage and therefore is not effected by load capacitance. In prior art planar photodiode devices which do not have an isolated diffusion region, that is, where the diffusion region is distributed, the expression for the output voltage $\Delta V$ produced by the light generated carriers is as follows:

$$\Delta V = Q/C_1 A_1 \quad [1]$$

where $Q$ represents the charge carriers, $C_1$ is the capacitance of the gate region per unit area and $A_1$ is the collection area which in the prior art is the photodiode area.

Thus, the magnitude of the device output voltage is reduced by the large load capacitance $C_1$ and the large collection area $A_1$.

On the other hand, the expression for the output voltage when the diffusion region is isolated as is diffusion region 16 in the present invention, is as follows:

$$\Delta V' = Q/C_2 A_2 \quad [2]$$

where $C_2$ is that capacitance per unit area only of the $n+$ diffusion region 16 and $A_2$ is the area 14 of the diffusion region 16.

The higher photosensitivity of the device of the present invention is indicated by the ratio of the output voltages as follows:

$$(\Delta V'/\Delta V) = Q/C_2 A_2 \times (C_1 A_1/Q) = (C_1 A_1/C_2 A_2)$$

Since both $C_2$ and $A_2$ are much smaller than $C_1$ and $A_1$, the device of the present invention having a diffusion region with a small relative collection area and which is biased to be electrically isolated from the photodiode area provides a much higher sensitivity than previous photodiodes. Also, because the effective output capacitance of the present device is small, the device exhibits lower thermal noise and higher speed than equivalent devices.

The embodiment shown in FIGS. 1 and 2 includes a p-type substrate and an $n+$ type diffusion region in which case the carriers produced by the photodiode are electrons. One skilled in the art should appreciate that other variations of the invention can be provided, for example, the substrate may be composed of n conductivity type material, the diffusion region may be p-type, and the carriers produced may be holes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A low capacitance charge-coupled semiconductor photodiode structure comprising, a semiconductor substrate layer of one conductivity type, a diffusion region of opposite conductivity type disposed in the surface of said substrate, the area of said diffusion region being substantially smaller than the area of said substrate surface, a first insulating layer disposed on said substrate surface exclusive of said area of said diffusion region, a layer of gate material disposed on the surface of said first insulating layer which in combination with said substrate layer forms a photodiode, a second insulating layer disposed on the surface of said gate layer and the surface of said diffusion region, a first electrically conductive contact extending through said second insulating layer to connect an output device to a portion of the surface of said diffusion region, a second electrically conductive contact for connecting a controllable bias voltage means to said layer of gate material for biasing said diffusion region positive to eliminate any inversion layer at the interface of said first insulating layer and said substrate and electrically isolating said diffusion region from said photodiode formed by said gate material and said first insulating layer, said photodiode being responsive to light radiation directed on said surface of said second insulating layer to generate charge carriers proportional to said light, said charge carriers being collected by said diffusion region to produce an electrical output signal on said first contact representative of said light radiation.

2. A photodiode structure according to claim 1 wherein said charge carriers are generated by said relatively large photodiode area $A_1$ and said generated charge carriers are collected by said relatively small diffusion area wherein said charge carriers generated by said light radiation is a quantity Q, said area of said diffusion region is $A_2$ and $C_2$ represents the capacitance per unit area of the diffusion region, and wherein the electrical output signal on said first contact representative of said first contact representative of said light radiation is proportional to $Q/C_2 A_2$.

3. A photodiode structure according to claim 2 wherein said substrate layer is composed of p-type material, said diffusion region is composed of $n+$ type material and said charge carriers are electrons.

4. A photodiode structure according to claim 2 wherein said substrate layer is composed of n-type material, said diffusion region is composed of p-type material and said charge carriers are holes.

* * * * *